United States Patent [19]

Nakai et al.

[11] Patent Number: 4,636,280

[45] Date of Patent: Jan. 13, 1987

[54] METHOD FOR THE PRETREATMENT OF A SUBSTRATE FOR ION IMPLANTATION

[75] Inventors: Ryusuke Nakai; Toshihiko Takebe, both of Osaka; Hajime Yamazaki, Isehara, all of Japan

[73] Assignees: Sumitomo Electric Ind., Ltd., Osaka; Nippon Telegraph & Telephone Public Corp., Tokyo, both of Japan

[21] Appl. No.: 643,034

[22] Filed: Aug. 21, 1984

[30] Foreign Application Priority Data

Aug. 23, 1983 [JP] Japan ............................. 58-154265

[51] Int. Cl.$^4$ ............................................... C30B 1/02
[52] U.S. Cl. ............................ 156/603; 156/DIG. 73; 148/187
[58] Field of Search ......... 148/DIG. 3, 1.5, DIG. 60, 148/187, DIG. 84; 156/605, DIG. 73, DIG. 66, 603; 29/576 B

[56] References Cited

U.S. PATENT DOCUMENTS

| | | | |
|---|---|---|---|
| 3,615,873 | 10/1981 | Sluss et al. | 148/1.5 |
| 4,220,483 | 9/1980 | Caziarra | 156/DIG. 73 |
| 4,357,180 | 11/1982 | Molnar | 148/1.5 |
| 4,447,497 | 5/1984 | Manasevit | 156/605 |
| 4,576,652 | 3/1986 | Hovel et al. | 148/187 |

FOREIGN PATENT DOCUMENTS 6140 1/1983 Japan ..................... 156/DIG. 66

OTHER PUBLICATIONS

Fisher et al., J. Electrochem Soc, vol. 123, No. 3, 3/76, pp. 434–435.
Komaleeva et al., Sov. Phys. Semicond V10, No. 2, 2/76, pp. 191–192.
Nagasawa et al., Appl. Phys. Lett. 37(7) 10/1/80, pp. 622–624.
R. L. Chapman et al., "Transient Annealing of Selenium-Implanted Gallium Arsenide Using a Graphite Strip Heater", 320 Applied Physics Letters, vol. 40(1982), pp. 805–807.
Fumio Shimura et al., "Thermally Induced Defect Behavior and Effective Intrinsic Gettering Sink in Silicon Wafers", 1046 Jnl of Electrochemical Sty, vol. 128(1981), pp. 1579–1583.

*Primary Examiner*—Hiram H. Bernstein
*Attorney, Agent, or Firm*—Wenderoth, Lind & Ponack

[57] ABSTRACT

An IC wafer with a uniform distribution of impurities is obtained by a pretreatment comprising annealing a semiconductor substrate at a high temperature for a long period of time and then cooling rapidly before IC processing.

7 Claims, 5 Drawing Figures

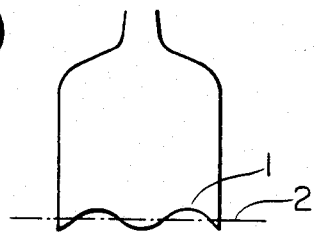
FIG. 1(a)
FIG. 1(b)
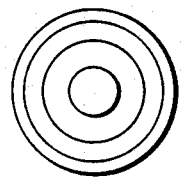
FIG. 2(a)
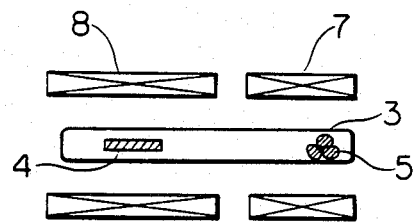
FIG. 2(b)
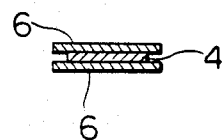
FIG. 3
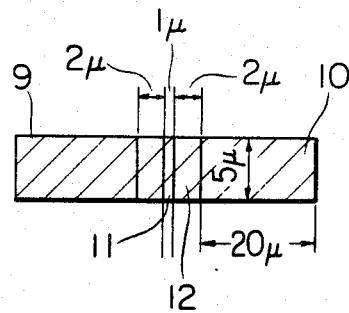

METHOD FOR THE PRETREATMENT OF A SUBSTRATE FOR ION IMPLANTATION

BACKGROUND OF THE INVENTION

1. Field of the Invention

This invention relates to a method for the pretreatment of a semiconductor substrate in the production of ICs by ion implantation of the semiconductor substrate.

2. Description of the Prior Art

When a substrate or wafer is cut out of, for example, undoped GaAs single crystal pulled by the liquid encapsulated Czochralsky method (LEC method) and subjected to ion-implantation to prepare IC, the uniformity to FET (field-effect transistor) characteristics in the wafer surface are not good. For example, when FETs are formed by ion implantation and subjected to measurement of the source-drain electric current, there is a dispersion of about 30% across the wafer. In order to obtain a good IC, this dispersion should be less than several percent. The dispersion is said to correspond to the distribution of dislocation density of a crystal, which is possibly due to the fact that the quantity of an impurity varies with the dislocation density through the reaction of dislocation and impurity.

Generally, an impurity in a material will be precipitated when exceeding its solubility, while it will be uniformly distributed when not exceeding its solubility. If even a single crystal by LEC method is held at a high temperature for a sufficiently long time, impurities must uniformly be distributed, since the higher is the temperature, the higher is the solubility. If there is a dislocation in a crystal, however, the dislocation attracts impurities (gettering action) when the bond energy of the dislocation and impurities is equal to the thermal energy of the impurities during cooling. In said case, the thermal energy is represented by kT wherein k is the Boltzmann constant and T is the absolute temperature, and kT is larger than the energy required for diffusion of the impurities. Thus, there occurs some distribution in the concentration of impurities on the dislocation rich sites and poor sites in a crystal.

When a single crystal is grown, the solid-liquid interface is not flat as exemplified in FIG. 1. The concentration of impurities along solid-liquid interface 1 is constant, but when a wafer is prepared by slicing along line 2, there occurs a nonuniform distribution of impurities as shown in FIG. 1(b).

SUMMARY OF THE INVENTION

It is an object of the present invention to provide a method for the pretreatment of a semiconductor substrate, whereby the above described problems can be solved.

It is another object of the present invention to provide a method for the pretreatment of a semiconductor wafer in the IC fabrication by ion implantation into the semiconductor wafer.

It is a further object of the present invention to provide a method of making a semiconductor substrate having a uniform distribution of impurities over the whole surface.

These objects can be attained by a method for the pretreatment of a semiconductor substrate, which comprises annealing the substrate at a high temperature for a long period of time and then quenching the substrate prior to IC processing.

BRIEF DESCRIPTION OF THE DRAWINGS

The accompanying drawings are to illustrate the principle and merits of the present invention in greater detail.

FIGS. 1(a) and (b) are vertical and lateral cross-sectional views to illustrate the state of a solid-liquid interface when a single crystal is grown and the distribution of impurities in a wafer sliced therefrom.

FIGS. 2(a) and (b) are to illustrate an annealing method according to one embodiment of the present invention, (a) being a longitudinal section of an apparatus for the practice of the annealing method and (b) being a cross section showing a method of supporting a wafer.

FIG. 3 is a plane view of a field effect transistor prepared by ion implantation into a substrate according to one embodiment of the present invention.

DETAILED DESCRIPTION OF THE INVENTION

The inventors have made efforts to overcome the disadvantages of the prior art and consequently have succeeded in obtaining a semiconductor substrate with a uniform distribution of impurities by subjecting a substrate to annealing at a high temperature for a long time, followed by cooling rapidly and ion implanting.

A semiconductor substrate used in the present invention is a substrate to be subjected to ion implantation, which consists of a semiconductor such as Group III-V compounds (e.g. GaAs, GaP, etc.), Si and Ge.

The present invention will now be illustrated as to a GaAs substrate, but the present invention is not intended to be limited thereto.

In the method of the present invention, for example, a GaAs wafer is subjected to annealing at a high temperature for a long period of time as described below under a pressure of As, and then to quenching.

| Temperature | Time |
| --- | --- |
| 1100° C. | 5-20 minutes |
| 1000° C. | 1-5 hours |
| 900° C. | 10-20 hours |

The annealing is preferably carried out at a temperature of 800° C. to 1100° C. for 10 minutes to 500 hours, and when using a good protection encapsulant, the annealing can be carried out without As pressure.

When the annealing is carried out, the impurities in the crystal gain heat energy and escape from the gettering sites such as dislocations, and the solubility thereof is increased. Thus, the precipitated impurities become individual molecules and are uniformly distributed and dissolved. The dislocation in the crystal is slightly recovered, but complete recovery of dislocation by annealing is difficult.

If for cooling, the temperature is gradually lowered, the impurities are again precipitated or gettered by dislocations. Therefore, the impurities must be frozen as uniformly distributed as possible by sufficiently lowering the temperature before the impurities diffuse to precipitation sites or gettering sites.

In the present invention, to this end, a wafer is annealed and then quenched. In this case, it is necessary to control the quenching rate so that any burden is not imposed on the wafer, although this is hard to undergo thermal strain because of having a very small thickness, e.g. about 500 μm. The quenching is generally carried out by withdrawing a wafer from the furnace and then cooling rapidly with oil or water, or by removing heaters in a furnace and then increasing the flow rate of nitrogen gas, e.g. to 1–100 m/s.

After ion implantation, another annealing treatment is carried out to heal irradiation defects due to the ion implantation and to activate implanted ions. Since this annealing treatment is carried out for the purpose of only heating irradiation defects and activating implanted ions and should avoid rearrangement of residual impurities or ion-implanted dopants, the conditions are more moderate, i.e. a lower temperature (e.g. about 800° C.) is used and shorter period of time (e.g. about 20 minutes) is employed as compared with those of the annealing treatment carried out before ion implantation according to the present invention. Accordingly, the objects of the present invention cannot be achieved by annealing after ion implantation.

The method for the pretreatment of a substrate for ion implantation according to the present invention has the following advantages: Before ion implantation, a semiconductor substrate is annealed at a high temperature for a long time and then quenched, so that the impurities in the crystal are uniformly distributed by the annealing and the concentration at high temperature is brought into a low temperature state as it is made uniform by the quenching, thus obtaining a wafer with a uniform distribution of impurities. After the subsequent ion implantation thereof, an IC wafer can be obtained with a uniform distribution of impurities over the whole surface as well as less dispersion properties (e.g. source-drain current).

EXAMPLE 1

An undoped semi-insulating GaAs wafer with a diameter of 1" and a thickness of 400 μm, prepared by an LEC method, was annealed before ion implantation by means of an annealing apparatus shown in FIG. 2(a). Referring to FIG. 2(a), a GaAs wafer 4 and an As element 5 were charged in a quartz tube 3 and vacuum sealed. GaAs wafer 4 was covered on both the surfaces with other wafers 6 and 6 as shown in FIG. 2(b) so as to prevent them from being contaminated with $SiO_2$. The system was heated at two temperatures by heaters 7 and 8 and annealed for 10 hours while keeping the temperatures of As at about 620° C. and that of GaAs at about 950° C. Then, a quartz tube 3 was rapidly taken out of the furnace and cooled at a cooling rate of at most about 300° C./min. The As pressure during the annealing in a quartz tube 3 was about 1 atm.

The wafer thus treated was subjected to a Si ion implantation with a dose of $2.0 \times 10^{12}/cm^2$ and an implantation energy of 60 KeV to form FETs having source 9, drain 10, gate 11 and active layer 12 obtained by the ion implantation of Si, as shown in FIG. 3, with an interval of 200 μm between the adjacent FETs. (The wafer was annealed at 800° C. and an As pressure for 20 minutes after implantation for healing the damage and activating the implanted ions.)

For comparison, the adjacent wafer which was not subjected to the above described annealing was subjected to the same FET processing.

The resulting wafer sample of the present invention and the reference wafer sample were subjected to measurement of the source-drain current Ids on the central area of 20×20 mm by a probing machine, (gate voltage=0), thus obtaining the results shown in Table 1:

TABLE 1

|  | Mean Value of Ids | Standard Deviation I of Ids | I/Mean Value of Ids (Distribution) |
| --- | --- | --- | --- |
| Sample of Our Invention | 190 μA | 5 μA | 2.6% |
| Reference Sample | 210 μA | 40 μA | more than 18% |

As is evident from Table 1, the FET of the present invention exhibits much less distribution of Ids than that of the prior art.

EXAMPLE 2

An undoped semi-insulating GaAs wafer with a diameter of 1" and a thickness of 400 μm, prepared by an LEC method and coated with an SiN layer of 1200 Å in thickness by a plasma-enhanced CVD method was annealed before ion implantation by means of another annealing apparatus provided with movable heaters (not shown) in an $N_2$ stream at 820° C. for 15 hours. Then, the wafer was then quenched by removing the heaters and increasing the flow rate of $N_2$ stream by three to five times, the average quenching rate being 15° C./min.

The wafer thus treated was then subjected to the same processing as Example 1, thus obtaining a sample wafer exhibiting a Vth of −0.724 V and σVth of 81 mV, while a non-treated sample exhibited a Vth of −0.713 V and σVth of 103 mV.

What is claimed is:

1. A method for the pretreatment of a semiconductor substrate, which comprises annealing a substrate consisting of a material selected from the Group III-V compounds containing impurities therein at a high temperature for a long period of time sufficient to uniformly distribute the impurities throughout the substrate and then quenching the substrate to freeze the impurities in a uniform state throughout the substrate before IC processing.

2. The method of claim 1, wherein the annealing is carried out at a temperature of 800° to 1100° C. for 10 minutes to 500 hours.

3. The method of claim 1, wherein the annealing is carried out under As pressure.

4. The method of claim 1, wherein the quenching is carried out at a cooling rate of 5° C./min to 500° C./min.

5. The method of claim 1, wherein the quenching is followed by IC processing including an activating annealing treatment.

6. The method of claim 6, wherein the activation annealing is carried out at a lower temperature for a shorter period of time than in the pretreatment.

7. The method of claim 1 wherein the annealing is carried out at a temperature of 800° to 1100° C. for 10 minutes to 500 hours and the quenching is carried out at a cooling rate of 5° C./min to 500° C./min.

* * * * *